United States Patent
Campbell

(10) Patent No.: US 7,262,614 B1
(45) Date of Patent: Aug. 28, 2007

(54) PLANAR ON EDGE PROBING TIP WITH FLEX

(75) Inventor: Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 11/352,128

(22) Filed: Feb. 10, 2006

Related U.S. Application Data

(60) Provisional application No. 60/652,046, filed on Feb. 10, 2005.

(51) Int. Cl.
*G01R 31/02* (2006.01)
(52) U.S. Cl. ........................ 324/754; 324/765
(58) Field of Classification Search ................ 324/754, 324/72.5
See application file for complete search history.

(56) References Cited

U.S. PATENT DOCUMENTS

| | | | |
|---|---|---|---|
| 4,491,788 A | 1/1985 | Zandonatti | |
| 4,552,465 A | 11/1985 | Anderson | |
| 4,923,407 A | 5/1990 | Rice et al. | |
| 5,914,612 A | 6/1999 | Koken et al. | |
| 5,939,890 A | 8/1999 | Kohen et al. | |
| 6,276,956 B1 | 8/2001 | Cook | |
| 6,828,768 B2 | 12/2004 | McTigue | |
| 6,967,473 B1 | 11/2005 | Reed et al. | |
| 2004/0066181 A1* | 4/2004 | Thies | 324/72.5 |
| 2006/0267604 A1* | 11/2006 | Yang | 324/754 |

FOREIGN PATENT DOCUMENTS

| | | |
|---|---|---|
| CH | 000667954 A | 11/1988 |
| JP | 10-282140 | 10/1998 |
| JP | 11-258270 | 9/1999 |

OTHER PUBLICATIONS

WaveLink Differential Probe, at least as early as May 2005, 11 pages, LeCroy Corporation, http://www.lecroy.com/tm/library/manuals/WaveLink/InstructionManual/WL_OM_REVC.pdf.

LeCroy WaveLink Probe System: Unprecedented Flexibility for Probe Interconnection, at least as early as Sep. 2005, 8 pages, LeCroy Corporation, http://www.lecroy.com/tm/products/Probes/Differential/WaveLink/WaveLink_DC_high.pdf.

Tektronix: Surface Mount Device Interconnects, at least as early as Feb. 9, 2006, 5 pages, Tektronix, http://www.tek.com/site/ps/0..60-10008-INTRO_EN,00.html.

* cited by examiner

*Primary Examiner*—Shuwang Liu
*Assistant Examiner*—Chris Von Benken
(74) *Attorney, Agent, or Firm*—Law Office of Karen Dana Oster, LLC

(57) ABSTRACT

A substantially planar (in an x-y plane) probing tip includes a probing tip body and two test point connector projections. The first test point connector projection is movably attached to the body to allow motion therebetween. The second test point connector projection is also attached to the body. The motion actuator actuates motion that the motion translator, in turn, converts to move at least one of the test point connector projection connection ends in a third dimension out of the x-y plane. The probing tip has an open position in which the relative distance between the test point connector projections is relatively large. The probing tip also has a closed position in which the relative distance between the test point connector projections is relatively small. In one alternative preferred embodiment, the second test point connector projection body end is also movably attached to the body to allow motion therebetween.

18 Claims, 12 Drawing Sheets

PLANAR ON EDGE PROBING TIP WITH FLEX

The present application is an application claiming the benefit under 35 USC Section 119(e) of U.S. Provisional Patent Application Ser. No. 60/652,046, filed Feb. 10, 2005. The present application is based on and claims priority from this application, the disclosure of which is hereby expressly incorporated herein by reference in its entirety.

BACKGROUND OF INVENTION

The present invention is directed to a probing tip and, more particularly, a planar on edge probing tip with flex.

Electrical signals are the blood that flows through electrical components. Connection mechanisms such as wires, traces, leads, legs, pins, vias, or other connection mechanisms act as the veins and arteries through which the signal blood flows. Electrical test probes are used to provide an electrical connection between electrical components and/or connection mechanisms and the testing instruments (e.g. oscilloscopes) that measure, monitor, diagnose, and/or process the signals.

An electrical test probe generally consists of a probing head, a cable, and a connector. The probing head may have an integral or replaceable probing tip that is suitable for making an electrical contact with electrical components. The probing head is attached to a first end of the cable and the connector is attached to the opposite end of the cable.

A differential test probe measures two signals and outputs a third signal representing the difference between the first signal and the second signal.

As the size of electrical components decreases, probing heads and probing tips get smaller.

BRIEF SUMMARY OF THE INVENTION

A substantially planar (in an x-y plane) probing tip includes a probing tip body, a first test point connector projection, and a second test point connector projection. The first test point connector projection is movably attached to the planar probing tip body to allow motion therebetween. The second test point connector projection is also attached to the planar probing tip body. The motion actuator actuates motion that the motion translator, in turn, converts to move at least one of the test point connector projection connection ends in a third dimension out of the x-y plane.

The probing tip has an open position in which the relative distance between the first test point connector projection and the second test point connector projection is relatively large. The probing tip also has a closed position in which the relative distance between the first test point connector projection and the second test point connector projection is relatively small.

In one alternative preferred embodiment, the second test point connector projection body end is also movably attached to the planar probing tip body to allow motion therebetween.

In one alternative preferred embodiment, the motion actuator actuates motion in a first linear direction and the motion translator converts the first linear direction into motion of at least one of the test point connector projection connection ends in a second linear direction.

In one alternative preferred embodiment, the motion actuator converts torque into linear force.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
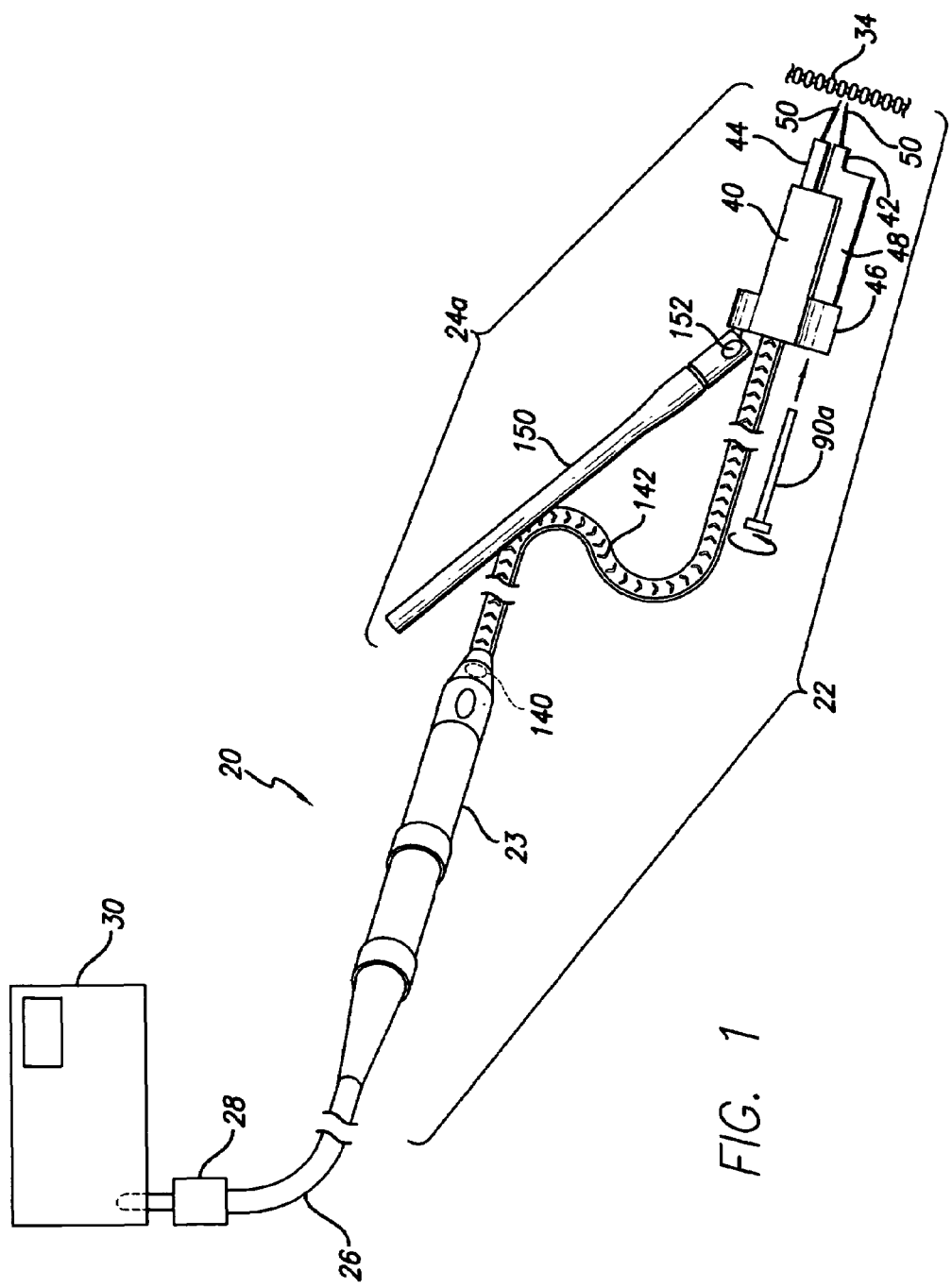
FIG. 1 is a schematic diagram of a first exemplary probing system in which the present invention may be used, the probing system including a planar probing tip implemented with a transmission line structure.

As shown in FIG. 1, an electrical test probe 20 generally consists of three parts: a probing head 22 (that, in turn, includes a main probing head gripping section 23 and a probing tip 24), a cable 26, and a probe/instrument connector 28. The probing head 22 is attached to a first end of the cable 26 and the probe/instrument connector 28 is attached to the opposite end of the cable 26. An electrical test probe 20 of the present invention may be used to provide an electrical connection between testing instruments 30 and electrical components 32 and/or connection mechanisms 34.

Figure 2:
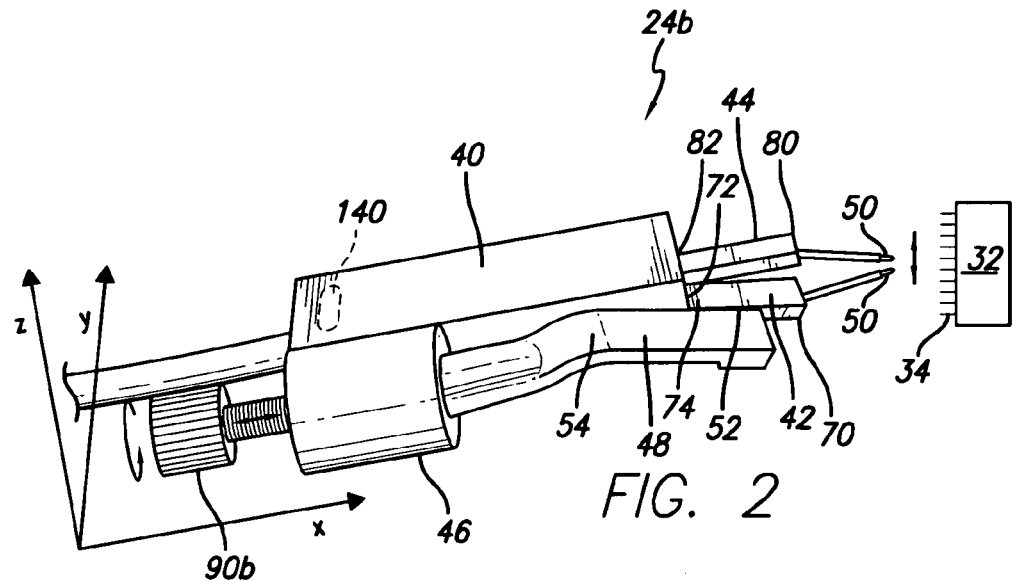
FIG. 2 is a perspective view of a second exemplary embodiment of a planar probing tip of the present invention in substantially closed relationship.
Figure 3:
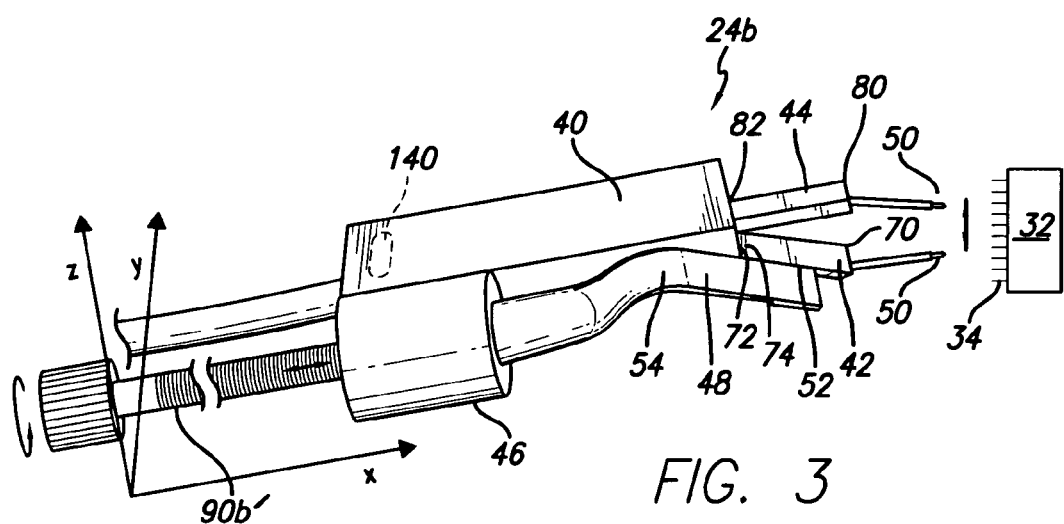
FIG. 3 is a perspective view of the second exemplary embodiment of the planar probing tip of FIG. 2 in substantially open relationship.
Figure 4:
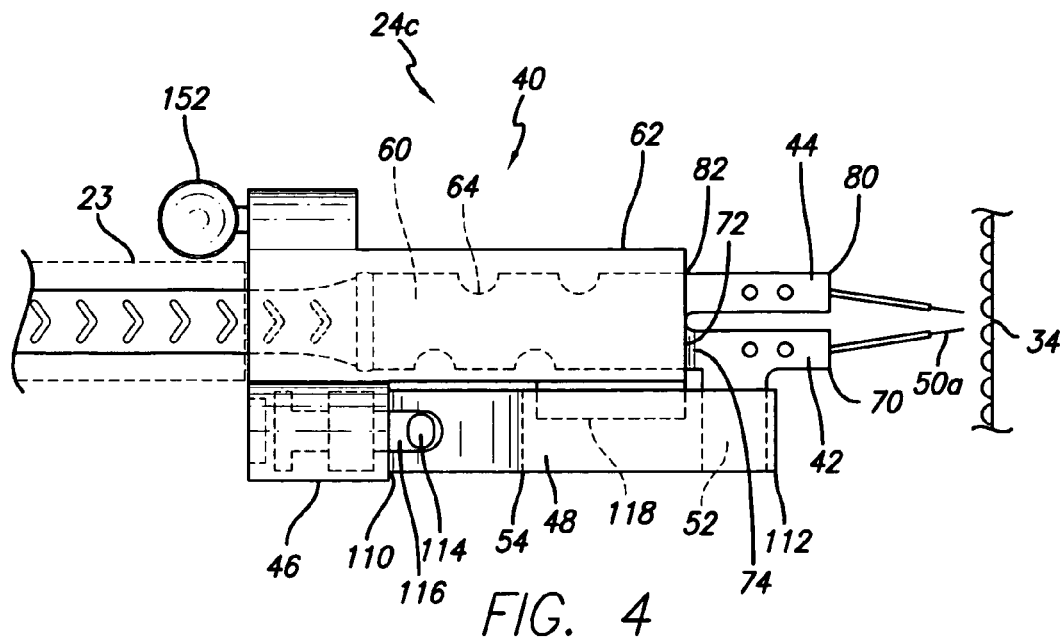
FIG. 4 is a top plan view of a third exemplary embodiment of a planar probing tip of the present invention with internal components shown in phantom, the planar probing tip having a body with two test point connector projections, each test point connector projection associated with at least one probing test point connector in an expanded state.
Figure 5:
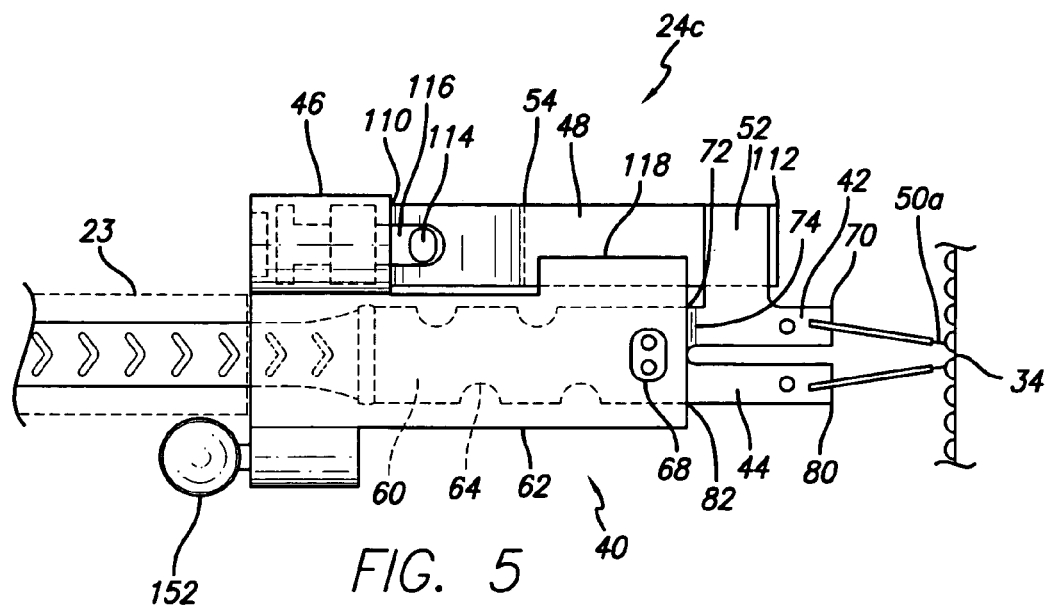
FIG. 5 is a bottom plan view of the third exemplary embodiment of the planar probing tip of FIG. 4 with the probing test point connectors in a contracted state.
Figure 9:
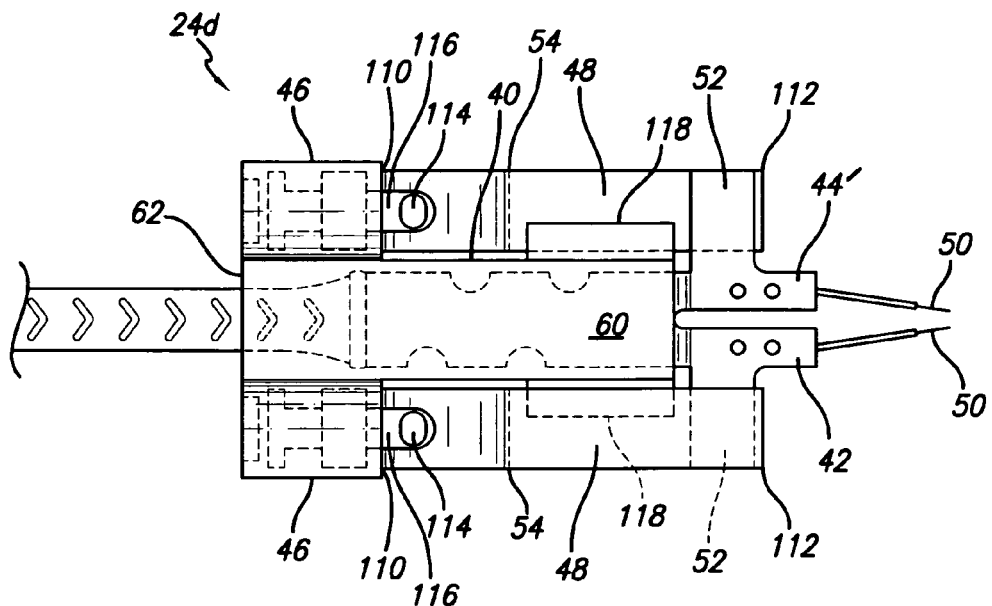
FIG. 9 is a top plan view of a fourth exemplary embodiment of a planar probing tip of the present invention with internal components shown in phantom, the planar probing tip having a body with two motion activatable test point connector projections, each motion activatable test point connector projection having an associated motion actuator.
Figure 10:
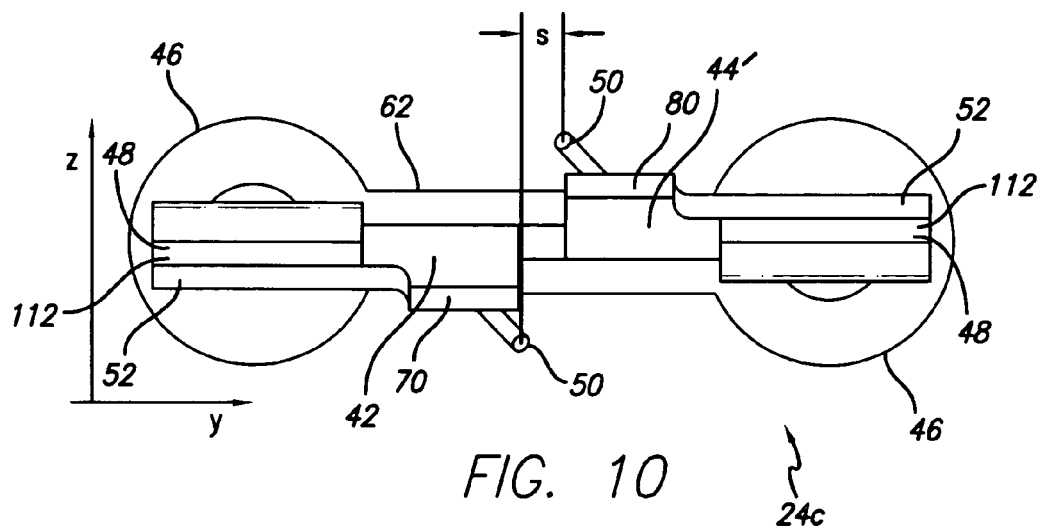
FIG. 10 is a front end view of the planar probing tip of FIG. 9.

The present invention is directed to a planar probing tip, exemplary alternative embodiments of which are shown in FIG. 1 as a planar probing tip 24a with transmission line structure, in FIGS. 2 and 3 as a planar probing tip 24b with a thumb screw, in FIGS. 4 and 5 as a planar probing tip 24c with an adjacent replaceable main probing head gripping section 23, and in FIGS. 9 and 10 as a planar probing tip 24d with dual movement. Before detailing the individual exemplary embodiments, the following paragraphs detail exemplary preferred characteristics of the probing tips 24a-d. The exemplary probing tips 24a-d are referred to generally as probing tip 24.

Figure 11:
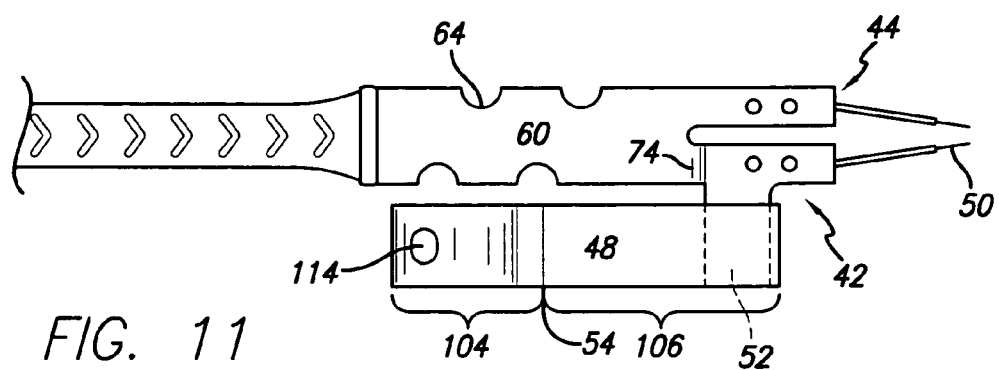
FIG. 11 is a top view of exemplary body and test point connector projections of a planar probing tip of the present invention.
Figure 12:
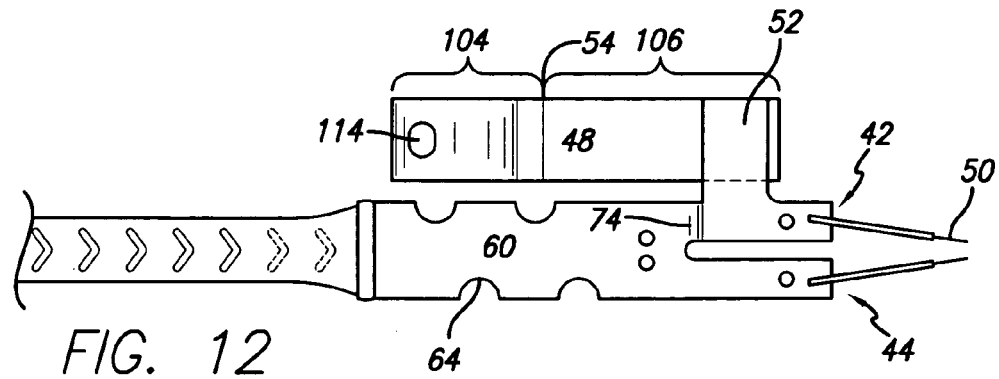
FIG. 12 is a bottom view of exemplary body and test point connector projections of a planar probing tip of the present invention.
Figure 13:
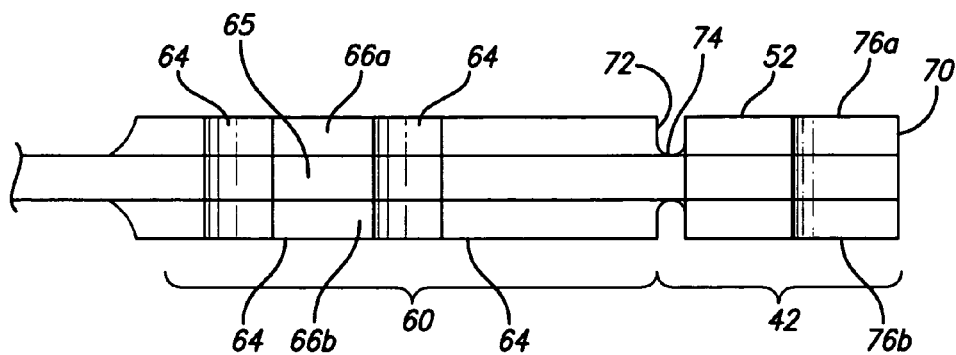
FIG. 13 is a side view of an exemplary body and test point connector projection of the planar probing tip of the present invention.
Figure 14:
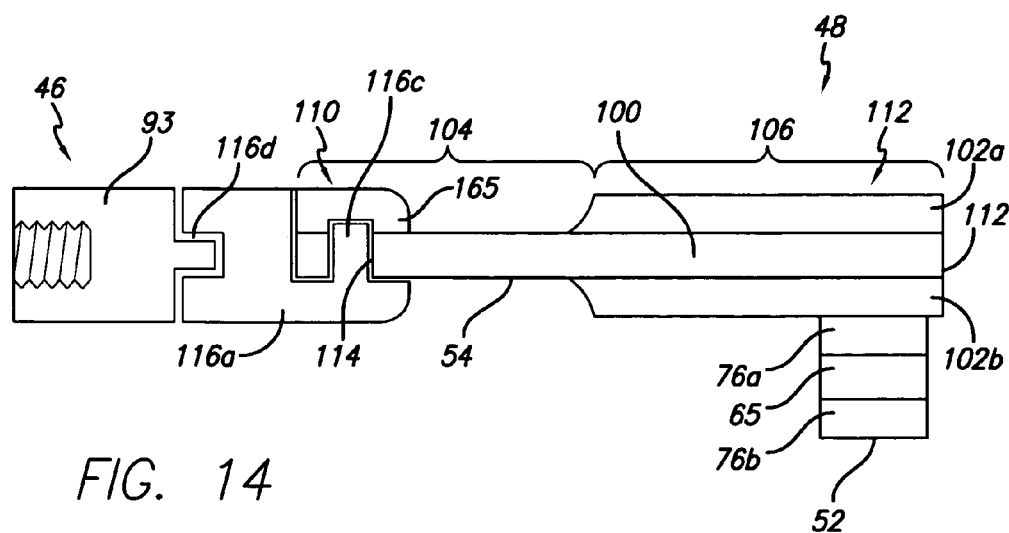
FIG. 14 is a cross-sectional side view of an exemplary motion translator of the planar probing tip of the present invention.
Figure 15:
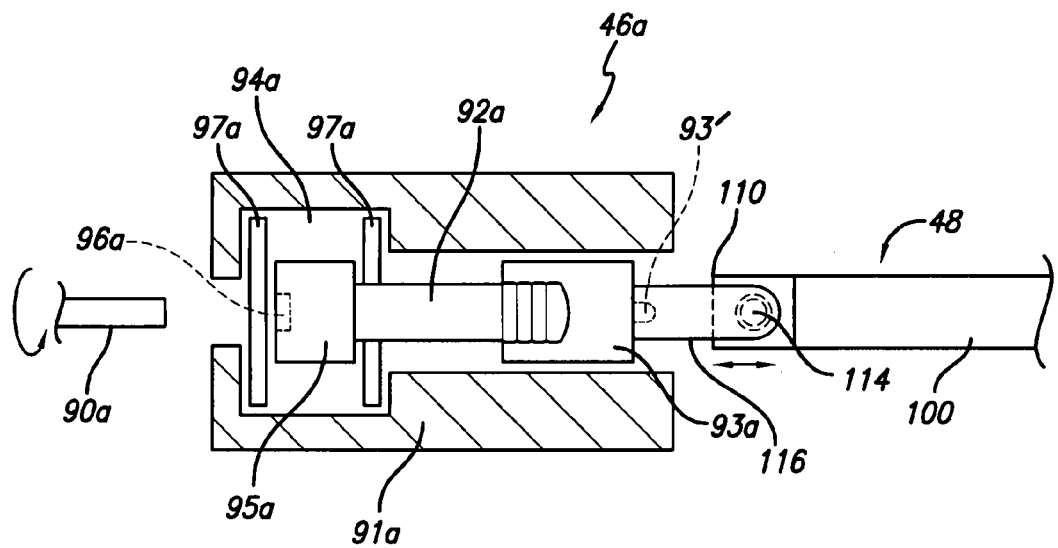
FIG. 15 is a cross-sectional top view of a first exemplary motion actuator.
Figure 16:
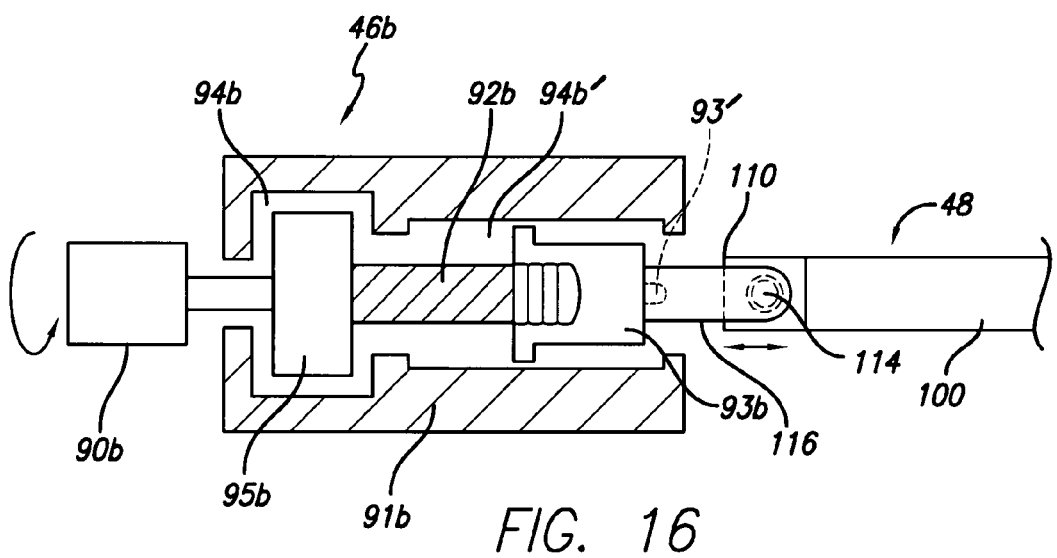
FIG. 16 is a cross-sectional top view of a second exemplary motion actuator.
Figure 17:
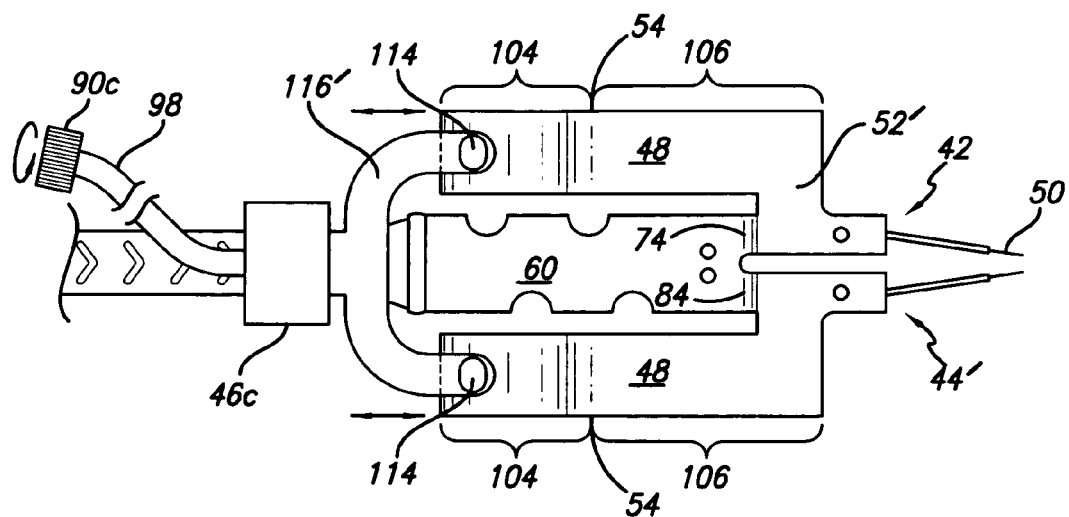
FIG. 17 is a top plan view of an exemplary body with two integral movable test point connector projections and their respective integral motion translators, a third exemplary motion actuator is connected to both motion translators, the third exemplary motion actuator being remotely actuatable.

In the shown embodiments, the planar probing tip 24 has a substantially planar body 40 (exemplary internal components of which are shown in FIGS. 11-13), a first test point connector projection 42 (shown in side view in FIG. 13), a second test point connector projection 44, at least one motion actuator 46, and at least one motion translator 48 (shown in side view in FIG. 14). Detailed exemplary embodiments of the motion actuator 46 are shown in FIGS. 15-17 as motion actuators 46a, 46b, and 46c. Each test point connector projection 42, 44 is designed to hold or be associated with at least one test point connector 50 (e.g. signal testers shown as a spring-loaded pogo pin 50a in FIGS. 18-19, as a flexible spring tip 50b in FIG. 20, and as a notched tip 50c in FIG. 21). The motion translator 48 is connected or linked (via link 52, 52') to a test point connector projection 42, 44 such that when the motion translator 48 moves, the associated linked test point connector projection 42, 44 also moves.

Figure 7:
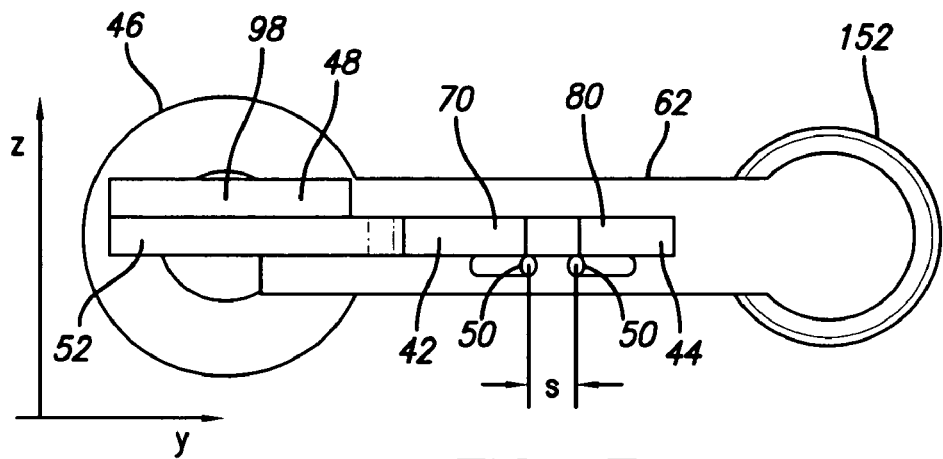
FIG. 7 is a front end view of a planar probing tip in substantially closed relationship.
Figure 8:
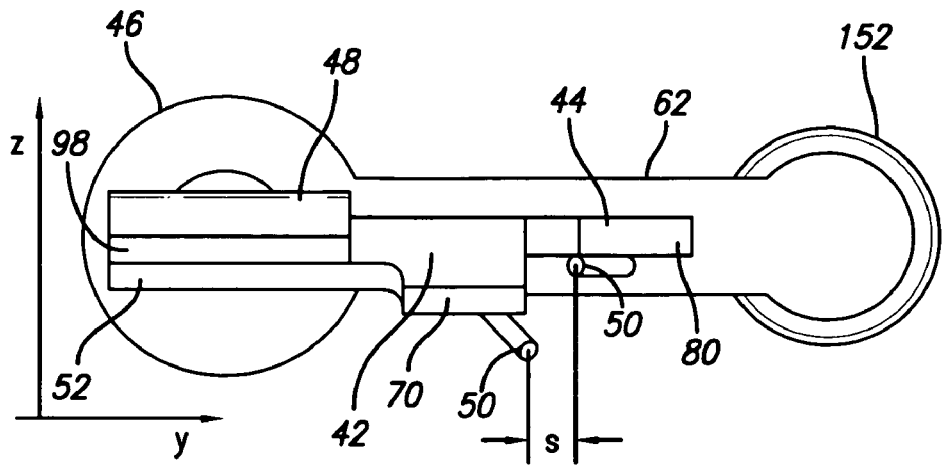
FIG. 8 is a front end view of a planar probing tip in substantially open relationship.

In practice, if a probing tip 24 is in a closed position (e.g. the connectors 50 are close together as shown, for example, in FIGS. 2, 4, 5, 7, and 9) and a user wants to widen the distance between the connectors 50 (e.g. open the probing tip 24 to an at least partially open position such as those shown, for example, in FIGS. 3, 8, and 10), the user would actuate the motion actuator 46. In one preferred embodiment, the motion actuator 46 would ultimately (directly or indirectly) actuate motion in a linear direction x (forward for opening). Because the motion actuator 46 is functionally attached to the motion translator 48, the motion translator 48 "translates" or "converts" the motion of the motion actuator 46. The motion translator 48 is connected or linked (via link 52) to a movable test point connector projection 42. Because the distance between the motion actuator 46 and the link 52 is fixed, the motion translator 48 cannot go forward, but instead flexes at or near hinge mechanism 54. If the hinge mechanism 54 moves upward (e.g. peaks), the remote end of the motion translator 48 moves downward. If the hinge 54 moves downward (e.g. valleys), the remote end of the motion translator 48 moves upward. The linked movable test point connector projection 42 moves in the same direction with the remote end of the motion translator 48. Causing the motion actuator 46 to actuate motion in a backward linear direction x (for closing), the motion translator 48 would "flatten," the hinge mechanism 54 would move back to its original position, and the linked movable test point connector projection 42 would move back to its original closed planar configuration.

Another way to describe how the probing tip 24 of the present invention work is that the user actuates the motion actuator 46 to initiate the movement of at least one test point connector projection 42, 44 such that the relative distance between the ends of the test point connector projections 42, 44 varies. In a preferred embodiment, when the relative distance between the ends of the test point connector projections 42, 44 is small (the closed position), the body 40 and test point connector projections 42, 44 are substantially planar (e.g. in the x-y plane that is shown as a horizontal plane). In a preferred embodiment, when the relative distance between the ends of the test point connector projections 42, 44 is relatively large (the open position), at least one test point connector projection 42 projects outward (e.g. in a third dimension represented by vector z) at an angle from the x-y plane. In other words, in the closed position, the test point connector projections 42, 44 are substantially planar (e.g. in a horizontal plane), but in the open position, at least one of the test point connector projections 42, 44 is moved off (or out of) the plane such that there is a distance (e.g. vertical to the original horizontal plane) between the test point connector projections 42, 44. This can be seen clearly by comparing FIG. 7 (closed position) with FIGS. 8 and 10 (open position). In FIG. 7, the test point connector projections 42, 44 are substantially planar such that they are aligned (at the same level) in relation to axis z. In FIGS. 8 and 10, however, the test point connector projections 42, 44 are at different levels on axis z. It should be noted, that in both the open and closed positions, the distance S between the test point connector projections 42, 44 along axis y is substantially constant. Put yet another way, if the planar probing tip 24 (e.g. the body 40 and test point connector projections 42, 44) are substantially planar, the movement between the test point connector projections 42, 44 is substantially perpendicular to the planar probing tip 24. It should be noted that the terms "horizontal" and "vertical" are relative terms and are not meant to limit the scope of the invention as the probing tip 24 can be used in any position.

One advantage of the probing tip 24 of the present invention is that it has a flat/planar configuration (at least the body 40 and the test point connector projections 42, 44 in the closed position) that may allow access to narrow slots not accessible by known differential probing heads. Another advantage of the discussed configurations is that they include a ground plane loop that is made relatively short. This would allow a probing tip 24 having this structure to go to 8 GHz or higher. Yet another advantage of many of the embodiments of the probing tip 24 of the present invention is that they may be made as a single mechanical piece that helps in manufacturing, cost, and durability. Finally, in the exemplary embodiments of the probing tip 24, the motion and pivot are very small as compared to other known probing tips. Minimal geometry, motion, pivot, and mechanics cause only tiny changes in the size of the electrical path as it transitions between the open and closed positions.

These changes are electrically nearly negligible. As compared to other known probing tips that have more significant changes, the relative minimal changes extend the bandwidth performance and otherwise enable superior performance.

The following paragraphs provide details of exemplary embodiments of the individual components of the present invention.

The body 40 of the planar probing tip 24 includes or supports a portion of the transmission path (e.g. a path that may be in the form of traces, wires, or other transmission means for carrying signals) that allows signals to be transmitted, for example, from the test point connector 50, through the probing head 22, cable 26, and probe/instrument connector 28, and to a testing instrument 30. In the shown embodiment, the body 40 is constructed at least partially from a flexible substrate 60 (shown in detail in FIGS. 11-14) or other type of flexible circuit board material enclosed within a body housing 62. The body flexible substrate 60 may include notches 64 or projections to help prevent the body flexible substrate 60 from shifting, moving, or rotating within the body housing 62. The body flexible substrate 60 may be coated or otherwise reinforced (shown as layers 66a and 66b in FIG. 13). Electronic components (e.g. transmission paths, traces, resistors, and capacitors) may be incorporated into or supported by the body 40. A body housing 62 may enclose all or part of the body flexible substrate 60. For purposes of example only, the body housing 62 may have a two-piece construction that is snap fit around the body flexible substrate 60. Alternatively, the body housing may be a single unit (e.g. a tube) with openings in which the body flexible substrate 60 with caps or end pieces completing the enclosure. Still another possibility would be to use an over-molding technique to enclose the body flexible substrate 60. In the shown embodiments, the test point connector projections 42, 44 extend from the body 40 and out through at least one opening of the body housing 62. As shown in FIG. 5, the body housing 62 may include one or more openings or windows 68 (e.g. a dielectric relief). A window 68 defined in a body housing 62 may, for example, provide access to optional components (e.g. passive components such as a capacitor or a resistor).

The first test point connector projection 42 includes or supports a portion of the transmission path that allows signals to be transmitted, for example, from the associated test point connector 50 to the transmission path of the body 40. The first test point connector projection 42 has a test connection end 70 and a body end 72 (FIGS. 4 and 5). The first test point connector projection body end 72 is movably attached to the body flexible substrate 60 of the body 40 to allow motion therebetween. In preferred embodiments, a hinge mechanism 74 (such as flex) between the first test point connector projection body end 72 and the body flexible substrate 60 provides a flexible connection therebetween. As shown in FIG. 13, the hinge mechanism 74 may be constructed using a single piece of flexible substrate 65 to create the combined body flexible substrate 60, first test point connector projection 42, and hinge mechanism 74. As discussed above, the body flexible substrate 60 may be coated or otherwise reinforced (shown as layers 66a and 66b). The first test point connector projection 42 may be similarly coated or otherwise reinforced (shown as layers 76a and 76b). The hinge mechanism 74 itself is uncoated or reinforced and, therefore, bendable. In one preferred embodiment, the flex of the hinge mechanism 74 may serve dual functions as both a flexible connection and as at least part of a transmission path (e.g. if a flexible trace is defined in the flex). As set forth above, the flex hinge mechanism 74 between the test point connector projection body end 72 and the body flexible substrate 60 may provide a flexible connection therebetween (e.g. function as a hinge). Further, the flex hinge mechanism 74 between the test point connector projection body end 72 and the body flexible substrate 60 may integrate (or support) the transmission path. The transmission path passes through the flex hinge mechanism 74 with little or no electrical alteration during actuation. By serving a dual purpose, the flex hinge mechanism 74 also reduces the number of mechanical parts needed in the probing tip 24. In alternative embodiments, alternative hinge mechanisms 74 (e.g. mechanical hinges) may be used to provide a flexible connection between the first test point connector projection body end 72 and the body flexible substrate 60.

The second test point connector projection 44 includes or supports a portion of the transmission path that allows signals to be transmitted, for example, from the associated test point connector 50 to the transmission path of the body 40. The second test point connector projection 44 has a test connection end 80 and a body end 82 (FIGS. 4 and 5). The second test point connector projection body end 82 is attached to the body flexible substrate 60 of the body 40. In some embodiments (e.g. the embodiments of FIGS. 1-5 and 7-8), the second test point connector projection 44 is fixed. In a fixed embodiment, the second test point connector projection 44 may be coated or otherwise reinforced (not shown). In a fixed embodiment, the coating or reinforcement of the second test point connector projection 44 may be integral with, continuous with, adjacent to, or overlapping the body flexible substrate 60 coating or reinforcement (shown as layers 66a and 66b). In alternate embodiments (e.g. the embodiment of FIGS. 9-10), the second test point connector projection (shown as second test point connector projection 44') is movable (e.g. the second test point connector projection body end 82 is movably attached to the body flexible substrate 60 to allow motion therebetween). A movable second test point connector projection 44' may include a hinge mechanism 84 (which may have a similar structure to the structure shown and discussed for hinge mechanism 74) between the second test point connector projection body end 82 and the body flexible substrate 60 to provide a flexible connection therebetween.

The motion actuator 46 actuates motion between the first test point connector projection 42 test connection end 70 and the second test point connector projection 44 test connection end 80. In other words, the user actuates the motion actuator 46 to initiate the movement of at least one test point connector projection 42, 44' such that the relative distance between the test point connector projections varies. In one preferred embodiment, the motion actuator 46 actuates motion in a first linear direction (e.g. forward and backward along an x axis) that the motion translator 48 translates or converts into motion of at least one of the test point connector projections 42, 44' in a second linear direction (e.g. up and down along a z axis). A motion actuator 46 of the present invention may incorporate, for example, a screw driver, a thumb screw, a lever, a button, a knob, a dial, or a digital actuator (e.g. computerized). Another way to describe preferred embodiments of the motion actuator is that it allows torque to be converted into linear force.

Exemplary motion actuators 46a (FIG. 15), 46b (FIG. 16), and 46c (FIG. 17) are discussed in detail below.

The motion translator 48, an exemplary embodiment of which is shown in detail in FIG. 14, translates or converts input from the motion actuator 46 to a moveable test point connector projection 42, 44'. In one preferred embodiment of the present invention, the motion translator 48 may be made of a flexible substrate 100 that is at least partially coated or reinforced (shown as layers 102*a* and 102*b*). In an alternative preferred embodiment of the present invention, the motion translator 48 is divided into at least two sections, a flexible first section 104 and a rigid second section 106. The flexible first section 104 is made from a flexible substrate or a jointed or hinged rigid material. Alternatively or in addition, a hinge mechanism 54 may divide the two sections 104, 106 to allow motion therebetween. The hinge mechanism 54 may be the flexible substrate 100 itself, a score in the flexible substrate, or a mechanical hinge. The motion translator 48 is functionally attached substantially at a first end 110 to the motion actuator 46 and substantially at a second end 112 to a moveable test point connector projection 42, 44'. In one preferred embodiment, the first end 110 of the motion translator 48 has a bore 114 therethrough. A connector 116 (FIGS. 15 and 16) mates with the bore 114 at the first end 110 of the motion translator 48 and extends to (and connects with) the motion actuator 46. For example, as shown in FIG. 14, a connector 116 may include a connector bottom molded piece 116*a* and a connector top molded piece 116*b* that are connected by the projection 116*c* that extends through the bore 114. The connector 116 may also include a bore 116*d* that mates with a projection 93' of the directional movement part 93 of the motion actuator 46. The connector 116 may be a molded piece or molded pieces, adhesive, plastic, and/or rubber).

FIG. 17 shows an exemplary connector 116' that might be used for connecting a single exemplary motion actuator 46*c* to a plurality of motion translators that, in turn, are attached respective test point connector projections. In this shown embodiment, the connector 116' is "Y-shaped" connector 116' such that the upper prongs mate with respective motion translators 48 and the lower prong mates with the motion actuator 46*c*. Alternative embodiments of the connector 116' that allow a single motion actuator 46*c* to actuate a plurality of motion translators and respective test point connector projections might be V-shaped (e.g. with the upper prongs mating with respective motion translators and the lower point mating with the motion actuator), T-shaped (e.g. with the T-shaped connector running between the test point connector projections and connecting to the inner edges thereof, or fork-shaped (e.g. for more than two movable test point connector projections). In one preferred embodiment, the second end 112 of the motion translator 48 is connected to a moveable test point connector projection 42, 44' using a link 52, 52'.

The link 52 may be any connection means including, but not limited to a tab, adhesive, a connector, integral layers of flex and rigid built in the PCB (printed circuit board) fabrication process, or any device with appropriate electrical properties that can be used to connect the motion translator 48 and the associated test point connector projection 42, 44. In the shown embodiments, the link 52 is shown as being integrally formed with a test point connector projection 42 (and in FIGS. 9 and 10, with both test point connector projections 42, 44') and attached to a motion translator 48. In alternative embodiments, the link may be integrally formed with a motion translator 48 and attached to a test point connector projection 42. FIG. 17 shows an alternative embodiment of a link 52' that is implemented by at least partially integrally forming the motion translator 48 and the associated test point connector projection 42, 44' (e.g. at least part of the motion translator 48 and the associated test point connector projection 42, 44 being fabricated from the same material such as the flex and/or reinforcement material).

Optional motion limiters 118 (e.g. as shown in FIGS. 4 and 5) may be used to help direct the appropriate hinging action of the hinge mechanisms 54. The motion limiters 118 may take the form of a back stop or projection. The motion limiters 118, as shown, may be attached to or integral with the body housing 62. In embodiments in which the hinge mechanisms 54 could hinge in either direction (e.g. a flexible substrate may be designed to bend or hinge both to the front and to the back), the use of a motion limiter 118 would provide certainty as to which way the hinge mechanisms 54 would hinge. Alternatively, the hinge mechanisms 54 could hinge in only one direction. If the hinge mechanisms 54 were unidirectional, then the motion limiter 118 would be substantially redundant.

Figure 20:
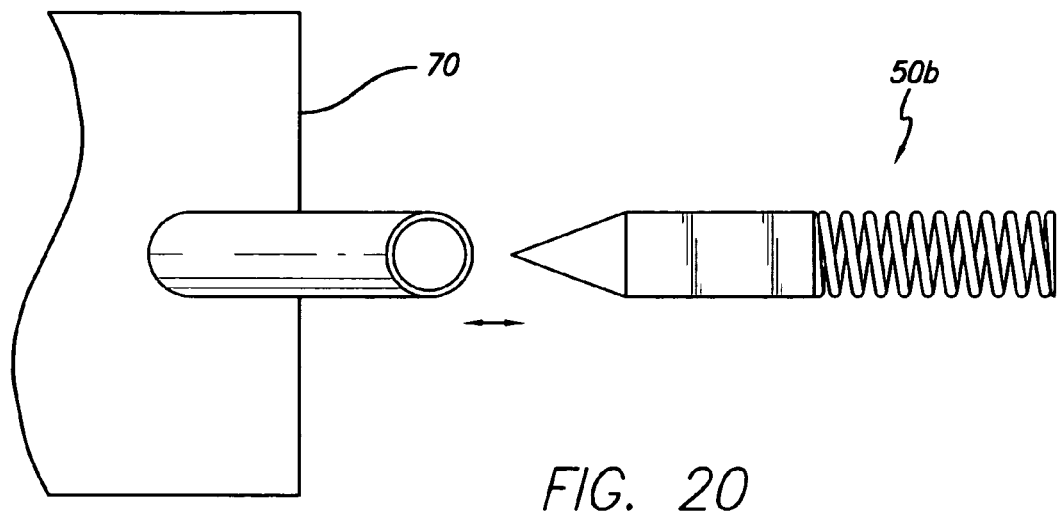
FIG. 20 is a top view of a test point connector projection with a replaceable test point connector, the replaceable test point connector shown as a socket and a flexible spring tip.

The test point connectors 50 are generally for making electrical contact with electrical component testing points such as connection mechanisms such as wires, traces, leads, legs, pins, and vias. The test point connectors 50 may be replaceable in relation to the test point connector projections 42, 44 as shown in FIG. 20. Alternatively, the test point connectors 50 may be integral in relation to the test point connector projections 42, 44 a shown in FIG. 21. In the closed position, the test point connectors 50 may be touching, substantially adjacent, or approximately the distance between two connection mechanisms 34. If the desired distance S between the test point connectors 50 in the closed position is closer than the distance between the test point connector projections 42, 44, then the test point connectors 50 may be angled (e.g. inward as shown).

The present invention may be a differential probing tip 24 or may be a single-ended probing tip 24 (e.g. where one of the test point connectors 50 functions as ground). A differential test probe measures two signals and outputs a third signal representing the difference between the first signal and the second signal.

Exemplary Motion Actuators:

FIG. 15 shows a first exemplary motion actuator 46*a* that is implemented using an external tool 90*a* such as a screwdriver. One advantage of this embodiment is that a user would have to consciously choose to actuate the motion actuator 46*a* (as opposed to accidentally or casually actuating a motion actuator). The motion actuator 46*a* includes at least three parts: a motion actuator fixed part 91*a* being fixed in relation to the body 40, a motion actuator rotating part 92*a* that rotates in relation to the fixed part 91*a*, and a motion actuator directional movement part 93*a* that moves in a predetermined direction (e.g. forward and backward along axis x). In this embodiment of the motion actuator 46*a*, the fixed part 91*a* is a sleeve. The fixed part 91*a* contains an interior chamber 94*a*. The rotating part 92*a* is a screw (e.g. a jack screw) that includes a shaft with an external helical thread (inclined plane). The rotating part 92*a* has a head 95*a* (with a tool accepter 96*a* such as a slot defined therein) that is positioned within the interior chamber 94*a*. Washers 97*a* help to hold the head 95*a* within the interior chamber 94*a*. The rotating part 92*a* rotates in relation to the sleeve 91*a*. The directional movement part 93*a* is a nut that has an internal helical groove that mates with the external helical thread of the rotating part 92*a*. As the rotating part 92*a* rotates, its external helical thread interacts with the internal helical groove of the directional movement part 93*a* causing the directional movement part 93*a* to move forward or backward in relation to the fixed part 91*a* depending on the direction in which the rotating part 92a is rotated. This configuration allows torque (from the external tool 90a) to be converted into linear force (the movement of motion actuator directional movement part 93a).

FIG. 16 shows a second exemplary motion actuator 46b that is implemented using an integral actuation mechanism 90b. In this case, "integral actuation mechanism" means that the user does not need an external tool or implement. The shown integral actuation mechanism is a thumb screw 90b. One advantage of this embodiment is the ease of use. For example, users of this embodiment would not need to look for a screwdriver and properly align the screwdriver before use. The motion actuator 46b includes at least three parts: a motion actuator fixed part 91b being fixed in relation to the body 40, a motion actuator rotating part 92b that rotates in relation to the fixed part 91b, and a motion actuator directional movement part 93b that moves in a predetermined direction (e.g. forward and backward along axis x). In this embodiment of the motion actuator 46b, the fixed part 91b is a sleeve. The fixed part 91b contains a first interior chamber 94b and a second interior chamber 94b' (defined by back and forward stops). The rotating part 92b preferably includes a shaft with an external helical thread (inclined plane) and a head 95b (that is attached to or functionally integral with the integral actuation member 90b). The head 95b is positioned within the interior chamber 94b and the directional movement part 93b is positioned within the interior chamber 94b'. The rotating part 92b rotates in relation to the sleeve 91b. The directional movement part 93b is a nut that has an internal helical groove that mates with the external helical thread of the rotating part 92b. As the rotating part 92b rotates, its external helical thread interacts with the internal helical groove of the directional movement part 93b causing the directional movement part 93b to move forward or backward in relation to the fixed part 91b depending on the direction in which the rotating part 92b is rotated. This configuration allows torque (from the integral actuation mechanism 90b) to be converted into linear force (the movement of motion actuator directional movement part 93b). It should be noted that the thumb screw may be an elongate thumb screw 90b' (FIG. 3).

FIG. 17 shows a third exemplary motion actuator 46c that is implemented using a remote actuation mechanism 90c. In this case, "remote actuation mechanism" means that there is a distance (e.g. at least 3 inches (6 centimeters)) between the motion actuator 46c and the actuation mechanism 90c. The shown remote actuation mechanism 90c is shown as a knob or dial, but it could be, for example, a lever, a joy stick, or a digital actuator (e.g. computerized). The remote actuation mechanism 90c may be separated from the motion actuator 46c by an extender 98 such as a cable or a wireless connection. The extender 98 could be attached to a thumb screw (not shown) or directly to a rotating part (not shown). Use of an extender would allow the user to remotely actuate the rotating part 92b. One advantage of using an extender is that it improves visibility. Another advantage of using an elongate thumb screw or an extender is that it may be easier for a user to use or access. Yet another advantage of using an extender is that isolates unwanted motion (e.g. only the actuation would be transmitted, not shaking or unwanted motion of the user).

Some of these advantages may also be applicable to the elongate thumb screw 90b' of FIG. 3.

It should be noted that the size of the motion actuator 46 is meant to be exemplary. A smaller motion actuator 46 (e.g. of the same thickness as the body 40) would allow the probing tip 24 to be inserted in narrower spaces.

Transmission Line Structure:

In one preferred embodiment shown in FIG. 1, the planar probing tip 24 is implemented with a transmission line structure. In this embodiment, the planar probing tip 24 is divided such that the test point connectors 50 are separated from a differential amplifier 140 by an elongate common substrate 142. In this embodiment, the body 40 is the portion of the probing tip 24 substantially adjacent to the test point connectors 50.

In embodiments of the present invention that are implemented using a transmission line structure, the transmission line structure technology may be the technology described in U.S. Pat. No. 6,822,463 (entitled Active Differential Test Probe With A Transmission Line Input Structure) and U.S. patent application Ser. No. 10/995,801 (entitled Transmission Line Input Structure Test Probe). These references have been assigned to LeCroy Corporation (the assignee of the present invention) and are hereby incorporated by reference. In a preferred embodiment of the present invention that incorporates a transmission line structure (e.g. as shown in FIG. 1), a differential electrical test probing tip 24 may be used for sensing a plurality of electric signals and generating a differential signal. The differential electrical test probing tip 24 includes an elongate common substrate 142 having two test point connectors 50 (signal testers) at one end and a differential amplifier 140 at the second end. Two transmission lines are on the common substrate 142, each connecting a respective signal test point to a signal input of the differential amplifier 140. The characteristic impedances of the two transmission lines are substantially equal. In one preferred embodiment, the common substrate 142 is a flexible substrate 142. In one preferred embodiment, an overmold, which may have gaps therein, at least partially encloses the common substrate 142, the first transmission line, and the second transmission line.

In the alternative preferred embodiment shown in FIGS. 2 and 3, the probing tip 24b includes a differential amplifier 140. In this embodiment, the differential amplifier 140 and test point connectors 50 are not separated. In this unitary embodiment, the body 40 may include an attached or integral differential amplifier 140.

It should be noted that other alternative preferred embodiments may not include a differential amplifier 140.

Test Point Connectors:

The test point connectors 50 are generally for making electrical contact with electrical component testing points. The testing points may be connection mechanisms that could be wires, traces, leads, legs, pins, and vias.

The test point connectors 50 may be replaceable in relation to the test point connector projections 42, 44 as shown in FIG. 20. Replaceable test point connectors 50 are test point connectors that are meant to be easily removed and replaced. Sockets or specially designed connectors may be used for this purpose. For example, the outer sleeve 120 in FIGS. 18-19 may function as a socket into which a removable and replaceable inner sleeve 121 (which contains the inner structure of a spring-loaded pogo pin test point connector 50a) may be positioned.

Figure 21:
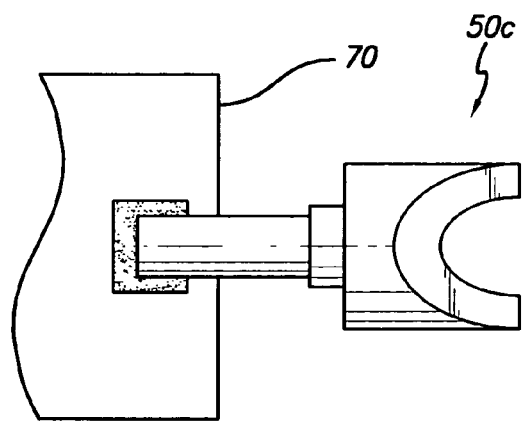
FIG. 21 is a top view of a test point connector projection with an integral test point connector, the integral test point connector shown as a notched tip.

Alternatively, the test point connectors 50 may be integral in relation to the test point connector projections 42, 44 as shown in FIG. 21. Integral test point connectors 50 are test point connectors that are not meant to be removed. They may be fabricated integrally or permanently attached (such that substantial manipulation or breakage is required for removal) to the projections 42, 44.

Figure 18:
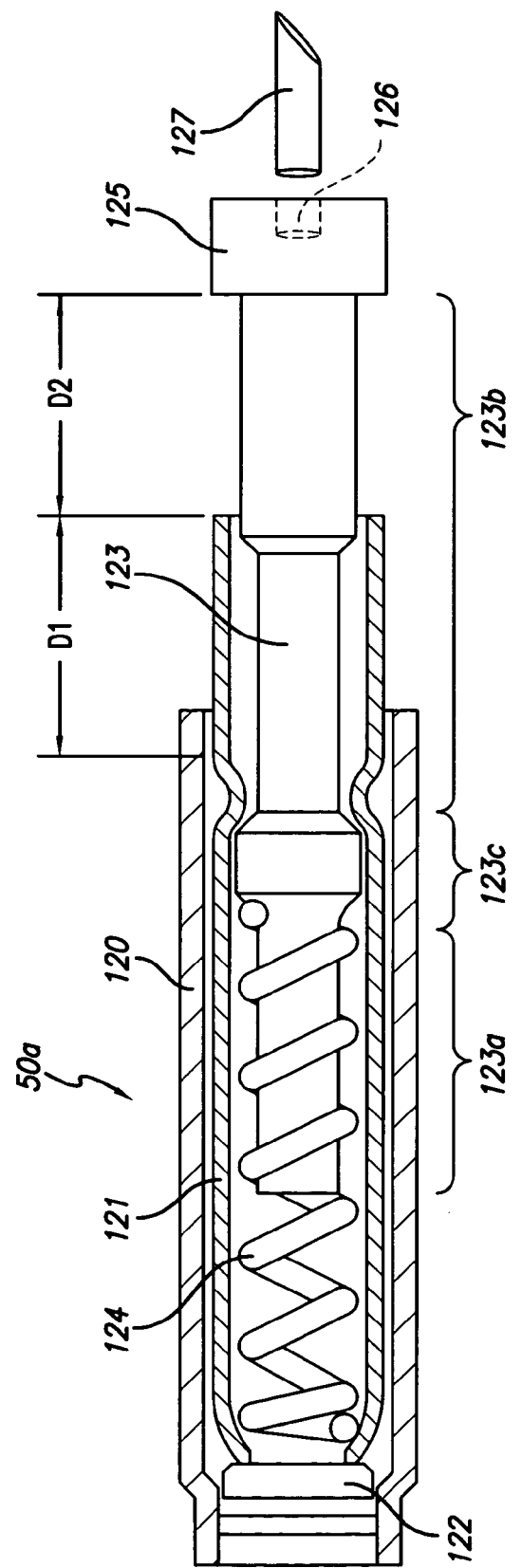
FIG. 18 is a cross-sectional view of an exemplary spring-loaded pogo pin test point connector in an expanded state.
Figure 19:
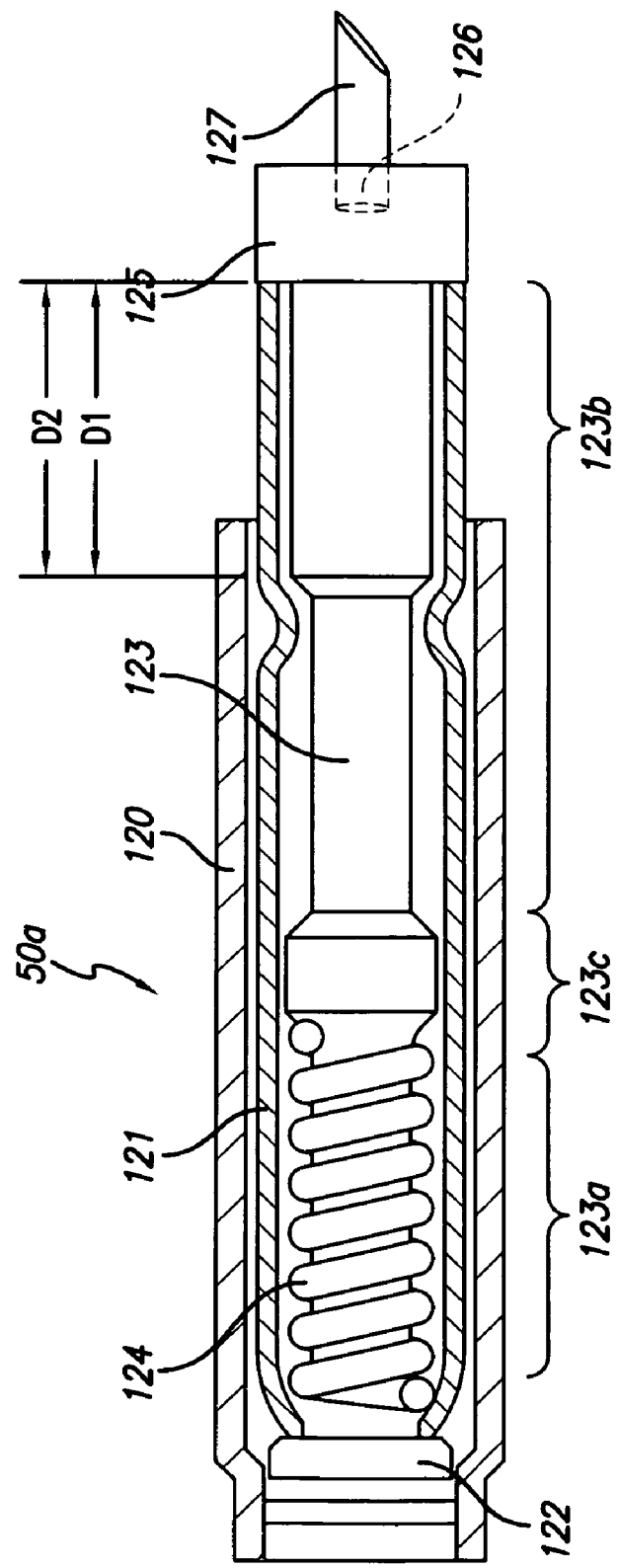
FIG. 19 is a cross-sectional view of an exemplary spring-loaded pogo pin test point connector in a contracted state.

The test point connector 50a shown in FIGS. 18-19 is a spring-loaded pogo pin. A pogo pin is generally used to contact pads on a circuit board. FIGS. 4 and 18 show the pogo pin test point connectors 50a being in an extended position. FIGS. 5 and 19 show the pogo pin test point connectors 50a being in a retracted position. The test point connector 50a shown in FIGS. 18-19 includes an outer sleeve 120, an inner sleeve 121, a conductive base 122 (at the end of inner sleeve 121), a shaft 123 (having a back spring section 123a and a front tip section 123b that are separated by a divider section 123c), a spring 124, a shoulder test point connector holder 125 (having a test point connector receptacle 126 defined therein), and a test point connector 127 (positionable within the test point connector receptacle 126). The spring 124 wraps around at least part of the back spring section 123a of the shaft 123 and provides an outward force tending to push the spring-loaded pogo pin test point connector 50a into an extended position (FIG. 18). Putting sufficient force on the test point connector 127 overcomes the spring's force such that the spring 124 compacts, and the shaft 123 slides into the inner sleeve 121 (FIG. 19). In one preferred embodiment, the shaft 123 only slides into the inner sleeve 121 until the shoulder test point connector holder 125 comes in contact with the annular rim of the inner sleeve 121. If the test point connector 127, shoulder test point connector holder 125, and inner sleeve 121 are made of material suitable for conducting a signal, the signal will flow therethrough to the conductive base 122 and through the transmission path of the present invention. In effect, the shoulder test point connector holder 125 coming into contact with the inner sleeve 121 "short circuits" the interior components (e.g. the shaft 123 and the spring 124). In the shown preferred embodiment, the length D1 is greater than or equal to the length D2. In one preferred embodiment, the test point connector 127 of the spring-loaded pogo pin test point connector 50a is constructed substantially from resistive material made of resistive conducting material substantially enclosed in and dispersed throughout encapsulating material. U.S. patent application Ser. No. 11/018,133 (entitled Resistive Probe Tip) and PCT Application No. PCT/US04/43884 (entitled Resistive Probe Tip), both of which have been assigned to LeCroy Corporation (the assignee of the present invention), are hereby incorporated by reference.

One alternative test point connector 50 is the test probe tip constructed substantially from resistive material that is described in U.S. patent application Ser. No. 11/018,133 (entitled Resistive Probe Tip) and PCT Application No. PCT/US04/43884 (entitled Resistive Probe Tip), both of which have been assigned to LeCroy Corporation (the assignee of the present invention) and are hereby incorporated by reference.

Another alternative test point connector 50 is the wedge test probe tip described in U.S. Design Patent No. D444,401 (entitled Electrical Test Probe Wedge Tip), U.S. Pat. No. 6,518,780 (entitled Electrical Test Probe Wedge Tip), and U.S. Pat. No. 6,650,131 (entitled Electrical Test Probe Wedge Tip), all of which issued to LeCroy Corporation (the assignee of the present invention) and are hereby incorporated by reference. The general shape of this wedge shaped alternative test point connector 50 is shown as the "point" in FIGS. 18 and 19.

As shown in FIG. 20, still another alternative test point connector 50b is the flexible spring probe tip described in U.S. Pat. No. 6,863,576 (entitled Electrical Test Probe Flexible Spring Tip) which issued to LeCroy Corporation (the assignee of the present invention) and is hereby incorporated by reference.

As shown in FIG. 21, yet another alternative test point connector 50c is the wedge test probe tip described in U.S. Design Patent No. D444,720 (entitled Notched Electrical Test Probe Tip), U.S. Pat. No. 6,538,424 (entitled Notched Electrical Test Probe Tip), U.S. Pat. No. 6,809,535 (entitled Notched Electrical Test Probe Tip), and U.S. patent application Ser. No. 10/971,344 (entitled Notched Electrical Test Probe Tip), all of which have been assigned to LeCroy Corporation (the assignee of the present invention) and are hereby incorporated by reference.

Probing Head:

The probing head 22 of the present invention may have an integral or replaceable probing tip 24. Replaceable probing tips 24 are probing tips that are meant to be easily removed and replaced. Sockets or specially designed connectors may be used for this purpose. Alternatively, the probing tips 24 may be integral in relation to the main probing head gripping section 23 of the probing head 22. Integral probing tips 24 are probing tips that are not meant to be removed. They may be fabricated integrally or permanently attached (such that substantial manipulation or breakage is required for removal) to the main probing head gripping section 23.

Various embodiments of the replaceable probing tip could incorporate subject matter of U.S. Pat. No. 6,956,362 (entitled Modular Active Test Probe And Removable Tip Module Therefor), U.S. Pat. No. 6,828,769 (entitled Cartridge System For A Probing Head For An Electrical Test Probe), U.S. Pat. No. 6,605,934 (entitled Cartridge System For A Probing Head For An Electrical Test Probe), and U.S. patent application Ser. No. 10/996,073 (entitled Cartridge System For A Probing Head For An Electrical Test Probe). These references have been assigned to LeCroy Corporation (the assignee of the present invention) and are hereby incorporated by reference. For example, the probing head 22 of the present invention may be implemented as a cartridge system in which the main probing head gripping section 23 is the main probing head body or is replaced by the main probing head body with electronics positioned therein and the probing tip 24 is implemented as a probing tip cartridge with a probing tip (planar probing tip 24). A minimally inductive electrical contact mechanism electrically would couple the electronics to the probing tip when the probing tip cartridge is in mating relationship with the main probing head body.

Figure 6:
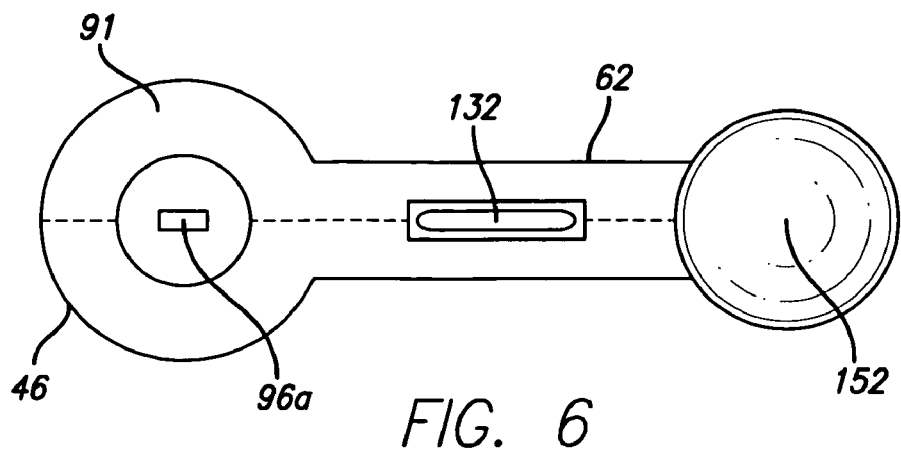
FIG. 6 is a back end view of a planar probing tip implemented with a transmission line structure.

Positioning:

At least part of the probing tip 24 may be "ball-mounted" to a holder 150 (FIG. 1). A ball-mounted embodiment of the present invention would include a ball joint 152 attached to the back end (FIG. 6) of the body 40 remote from the test point connectors 50. The holder 150 includes a socket that encloses the ball joint 152. The ball joint 152 is able to rotate within the socket of the holder 150. The holder 150 may have a means for tightening the socket or otherwise limiting the movement of the ball joint 152 therein. In such an embodiment, the ball joint 152 may rotate freely in the socket of the holder 150 and then, when the movement limiting mechanism is actuated, the ball joint 152 is held in place. Alternatively, the ball joint 152 may rotate with sufficient friction within the socket of the holder 150 so that the body 40 may be easily positioned by a user's fingertips, but then holds its position. The holder 150 may be removably connectable (and replaceable) to the ball joint 152 or permanently connectable to the ball joint 152.

Ball-mounting provides flexibility for the user to position the connectors 50. For example, because of the length of the handle of the holder 150, a user is provided with additional length to reach distant connection mechanisms 34. Because the holder 150 can be relatively thin or narrow, the user is able to probe connection mechanisms 34 in places where his hand might not be able to reach. Also, the body 40 can be set at almost any desired angle in relation to the holder 150 which could not be accomplished if a handle was fixed to the body 40. Still further, the position of the body 40 can be adjusted without moving the remainder of probing head 22 and/or probing tip 24.

Although the holder 150 is shown as being a simple handle-type holder, in alternative embodiments, a holder may incorporate legs, or bendable structure, and/or adhereable structure. The legs may be similar to those described in U.S. Pat. No. 6,462,529 (entitled Legs For Forming A Tripod With An Electrical Test Probe) which issued to LeCroy Corporation (the assignee of the present invention) and is hereby incorporated by reference. The bendable structure and/or adhereable structure may be similar to the structure described in U.S. patent application Ser. No. 11/286,787 (entitled Adherable Holder For Test Probe Tip) which has been assigned to LeCroy Corporation (the assignee of the present invention) and is hereby incorporated by reference.

Geometry:

In one preferred embodiment, the probing tip 24 has an extremely small geometry. A probing tip 24 having the flat/planar configuration may allow access to narrow slots not accessible by known differential probing heads.

In one preferred embodiment, this configuration includes a ground plane loop that is made relatively short. This would allow a probing tip 24 having this structure to go to 8 GHz or higher.

In one preferred embodiment, the probing tip 24 is made as a single mechanical piece.

It should be noted that the figures are not drawn to scale. Even among the figures, sizes of various elements may be disproportionate. The size of the various components would be based on considerations including, but not limited to intended use, technical considerations, and manufacturing considerations. For purposes of example only, the following are exemplary measurements: a main probing head gripping section 23 may have a length of approximately 2-4 inches (5-10 centimeters); a probing tip 24 using the transmission line structure (including the test point connectors 50, differential amplifier 140, and elongate common substrate 142) may have a length of approximately 6-8 inches (15-20 centimeters); a body 40 and the test point connector projections 42, 44 together may have a length of approximately 0.5-1.5 inches (1-4 centimeters); a body housing 62 (enclosing body 40) may have a thickness of approximately 0.1-0.2 inches (0.2-0.4 centimeters); a reinforced body flexible substrate 60 (including layers 66a and 66b) may have a thickness of less than 0.05 inches (0.1 centimeters); and spring-loaded pogo pin test point connectors 50 (in their expanded state) may have a length of approximately 0.1-0.3 inches (0.2-0.8 centimeters).

SPECIFIC EXEMPLARY EMBODIMENTS

The following paragraphs detail several exemplary embodiments. It should be noted that additional embodiments may be made by combining elements of these exemplary embodiments as well as by combining additional elements shown in the drawings and/or discussed elsewhere in this specification.

FIG. 1 shows a preferred exemplary embodiment of a planar probing tip 24a with transmission line structure. The planar probing tip 24a attaches to a main probing head gripping section 23. The planar probing tip 24a of this embodiment is divided such that the body 40 and the test point connectors 50 are separated from the differential amplifier 140 by an elongate common substrate 142. The planar probing tip 24a has a substantially planar body 40, a first movable test point connector projection 42, a second stationary test point connector projection 44, a single motion actuator 46, and a single motion translator 48. The motion actuator 46 is shown as being actuated by an external tool 90a such as a screwdriver. Each test point connector projection 42, 44 is associated with a single test point connector 50. The motion translator 48 is connected to the movable test point connector projection 42 such that when the motion translator 48 moves, the associated linked movable test point connector projection 42 also moves. The body 40 of this embodiment includes a ball joint 152 for ball-mounting to a holder 150.

FIGS. 2 and 3 show a preferred exemplary embodiment of a planar probing tip 24b with an integral actuation mechanism. The probing tip 24b includes a differential amplifier 140 (in phantom) that is included in the body 40. As with the planar probing tip 24a, the planar probing tip 24b has a substantially planar body 40, a first movable test point connector projection 42, a second stationary test point connector projection 44, a single motion actuator 46, and a single motion translator 48. The motion actuator 46 is shown as being actuated by an integral actuation mechanism. The integral actuation mechanism may be a thumb screw 90b (FIG. 2) or an elongate thumb screw 90b' (FIG. 3). Each test point connector projection 42, 44 is associated with a single test point connector 50. The motion translator 48 is connected to the movable test point connector projection 42 such that when the motion translator 48 moves, the associated linked movable test point connector projection 42 also moves. This embodiment of the planar probing tip 24b does not specifically include a means for holding or mounting. In one preferred embodiment, the body 40 may be elongated such that a user would directly hold the body 40 (effectively incorporating the main probing head gripping section). There may also be specially developed holders, grips, and/or mounters.

FIGS. 4 and 5 show a preferred exemplary embodiment of a planar probing tip 24c with an adjacent replaceable main probing head gripping section 23. As with the previous planar probing tips 24a, 24b, the planar probing tip 24c has a substantially planar body 40, a first movable test point connector projection 42, a second stationary test point connector projection 44, a single motion actuator 46, and a single motion translator 48. Although the motion actuator is shown as being actuatable by an external tool (e.g. the motion actuator 46a of FIG. 15), a motion actuator with an integral actuation mechanism (e.g. the motion actuator 46b of FIG. 16) could also be used. Each test point connector projection 42, 44 is associated with a single test point connector (shown as spring-loaded pogo pin 50a). The motion translator 48 is connected to the movable test point connector projection 42 via a link 52 such that when the motion translator 48 moves, the associated linked movable test point connector projection 42 also moves. This embodiment of the planar probing tip 24c is meant to be associated with a main probing head gripping section 23 (shown in phantom). The main probing head gripping section 23 and planar probing tip 24c would include appropriate structure for physically and electrically connecting the two parts. In one preferred embodiment, the planar probing tip 24c is meant to be removable and replaceable in relation to the main probing head gripping section 23. Appropriate structure may be, for example, the structure set forth in U.S. Pat. No. 6,956,362, U.S. Pat. No. 6,828,769, U.S. Pat. No. 6,605,934, and/or U.S. patent application Ser. No. 10/996,073, which have been incorporated by reference.

FIGS. 9 and 10 show a preferred exemplary embodiment of a planar probing tip 24d with dual movement. The planar probing tip 24c has a substantially planar body 40, a first movable test point connector projection 42, a second movable test point connector projection 44', two motion actuators 46, and two motion translators 48. Each motion translator 48 is connected to an associated movable test point connector projection 42, 44' via a link 52 such that when the motion translators 48 move, the associated linked movable test point connector projections 42, 44' also move. Although the motion actuators are shown as being actuatable by an external tool (e.g. the motion actuator 46a of FIG. 15), motion actuators with an integral actuation mechanism (e.g. the motion actuator 46b of FIG. 16) could also be used. Each test point connector projection 42, 44' is associated with a single test point connector 50. One advantage of having dual movement is that it increases the span between the connectors associated with the movable test point connector projection 42, 44'.

FIG. 17 shows an alternative embodiment of a planar probing tip with dual movement in which a single exemplary motion actuator 46c is attached to a plurality of motion translators 48 that, in turn, are attached to the movable test point connector projections 42, 44'. In this shown embodiment, the upper prongs of a "Y-shaped" connector 116' mate with respective motion translators 48 and the lower prong mates with the motion actuator 46c. So that the first movable test point connector projection 42 moves in a first direction and the second movable test point connector projection 44' moves in a second direction, there must be some control as to the direction that the test point connector projections 42, 44' will move when actuated. This may be accomplished, for example, using unidirectional hinge mechanisms 54 and/or motion limiters 118 (e.g. as shown in FIGS. 4 and 5) may be used to help direct the appropriate hinging action of the hinge mechanisms 54. This embodiment also shows an alternative embodiment of a link 52' that is implemented by at least partially integrally forming the motion translator 48 and the associated test point connector projection 42, 44'. This exemplary motion actuator 46c is remotely actuatable by remote actuation mechanism 90c.

It should be noted that the term "end" is meant to be relative. For example, in FIGS. 4 and 5, the first end 110 of the motion translator 48 may be towards the actual end of the motion translator, but not the extreme end.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A planar probing tip comprising:
   (a) a planar probing tip body, a first test point connector projection, a second test point connector projection, a motion actuator, and a motion translator;
   (b) said first test point connector projection having a first test point connector projection connection end and a first test point connector projection body end, said first test point connector projection body end movably attached to said planar probing tip body to allow motion therebetween;
   (c) said second test point connector projection having a second test point connector projection connection end and a second test point connector projection body end, said second test point connector projection body end attached to said planar probing tip body;
   (d) said motion translator attached at a first end to said motion actuator and at a second end to at least one of said test point connector projections, said motion translator for converting input from said motion actuator to at least one of said test point connector projection connection ends; and
   (e) said motion actuator for selectively actuating motion between said at least one of said test point connector projection connection ends and said planar probing tip body;
   (f) wherein said planar probing tip body, said first test point connector projection, and said second test point connector projection are substantially planar in an x-y plane, said motion translator for converting input from said motion actuator to at least one of said test point connector projection connection end in a third dimension out of said x-y plane.

2. The planar probing tip of claim 1, said planar probing tip having an open position and a closed position, the relative distance between said first test point connector projection connection end and said second test point connector projection connection end being relatively large in said open position, and the relative distance between said first test point connector projection connection end and said second test point connector projection connection end being relatively small in said closed position.

3. The planar probing tip of claim 1, wherein flex between said first test point connector projection body end and said planar probing tip body provides a flexible connection therebetween.

4. The planar probing tip of claim 1, wherein said second test point connector projection body end is movably attached to said planar probing tip body to allow motion therebetween, wherein flex between said second test point connector projection body end and said planar probing tip body provides a flexible connection therebetween.

5. The planar probing tip of claim 1, wherein said motion actuator actuates motion in a first linear direction and said motion translator converts said first linear direction into motion of at least one of said test point connector projection connection ends in a second linear direction.

6. The planar probing tip of claim 1, wherein said motion actuator converts torque into linear force.

7. The planar probing tip of claim 1, wherein said motion actuator is actuated using actuating means selected from the group consisting of:
   (a) an external tool;
   (b) an integral actuation mechanism; and
   (c) remote actuation mechanism.

8. The planar probing tip of claim 1, wherein said planar probing tip uses a transmission line structure.

9. A planar probing tip comprising:
   (a) a planar probing tip body, a first test point connector projection, a second test point connector projection, a motion actuator, and a motion translator;
   (b) said first test point connector projection having a first test point connector projection connection end and a first test point connector projection body end, said first test point connector projection body end movably attached to said planar probing tip body to allow motion therebetween;

(c) said second test point connector projection having a second test point connector projection connection end and a second test point connector projection body end, said second test point connector projection body end attached to said planar probing tip body;
(d) said motion translator attached at a first end to said motion actuator and at a second end to at least one of said test point connector projections, said motion translator for converting input from said motion actuator to at least one of said test point connector projection connection ends; and
(e) said motion actuator for selectively actuating motion between said at least one of said test point connector projection connection ends and said planar probing tip body;
(f) wherein said motion translator is at least partially made of flex.

10. A planar probing tip comprising:
(a) a planar probing tip body, a first test point connector projection, a second test point connector projection, a motion actuator, and a motion translator;
(b) said first test point connector projection having a first test point connector projection connection end and a first test point connector projection body end, said first test point connector projection body end movably attached to said planar probing tip body to allow motion therebetween;
(c) said second test point connector projection having a second test point connector projection connection end and a second test point connector projection body end, said second test point connector projection body end attached to said planar probing tip body;
(d) said motion translator attached at a first end to said motion actuator and at a second end to at least one of said test point connector projections, said motion translator for converting input from said motion actuator to at least one of said test point connector projection connection ends; and
(e) said motion actuator for selectively actuating motion between said at least one of said test point connector projection connection ends and said planar probing tip body;
(f) wherein said motion translator is divided into two sections, a hinge mechanism dividing said two sections to allow motion therebetween.

11. A planar probing tip comprising:
(a) a planar probing tip body, a first test point connector projection, a second test point connector projection, a motion actuator, and a motion translator;
(b) said planar probing tip body, said first test point connector projection, and said second test point connector projection being substantially planar in an x-y plane;
(c) said first test point connector projection having a first test point connector projection connection end and a first test point connector projection body end, said first test point connector projection body end movably attached to said planar probing tip body to allow motion therebetween;
(d) said second test point connector projection having a second test point connector projection connection end and a second test point connector projection body end, said second test point connector projection body end attached to said planar probing tip body;
(e) said motion translator attached at a first end to said motion actuator and at a second end to at least one of said test point connector projections; and
(f) said motion actuator for actuating motion in a third dimension out of said x-y plane between said first test point connector projection connection end and said second test point connector projection connection end.

12. The planar probing tip of claim 11, said planar probing tip having an open position and a closed position, the relative distance between said first test point connector projection connection end and said second test point connector projection connection end being relatively large in said open position, and the relative distance between said first test point connector projection connection end and said second test point connector projection connection end being relatively small in said closed position.

13. The planar probing tip of claim 11, wherein said second test point connector projection body end is movably attached to said planar probing tip body to allow motion therebetween.

14. The planar probing tip of claim 11, wherein said motion actuator actuates motion in a first linear direction and said motion translator converts said first linear direction into motion of at least one of said test point connector projection connection ends in a second linear direction.

15. The planar probing tip of claim 11, wherein said motion actuator converts torque into linear force.

16. A planar probing tip comprising:
(a) a planar probing tip body, a first test point connector projection, a second test point connector projection, a motion actuator, and a motion translator;
(b) said first test point connector projection having a first test point connector projection connection end and a first test point connector projection body end, said first test point connector projection body end movably attached to said planar probing tip body to allow motion therebetween;
(c) said second test point connector projection having a second test point connector projection connection end and a second test point connector projection body end, said second test point connector projection body end attached to said planar probing tip body;
(d) said motion translator attached at a first end to said motion actuator and at a second end to at least one of said test point connector projections;
(e) said probing tip having an open position in which the relative distance between said first test point connector projection connection end and said second test point connector projection connection end is relatively large;
(f) said probing tip having a closed position in which the relative distance between said first test point connector projection connection end and said second test point connector projection connection end is relatively small; and
(g) said motion actuator for actuating motion between said first test point connector projection connection end and said second test point connector projection connection end to transition between said open position and said closed position, said motion being substantially perpendicular to said planar probing tip;
(h) wherein said planar probing tip body, said first test point connector projection, and said second test point connector projection are substantially planar in an x-v plane, said motion translator for converting input from said motion actuator to at least one of said test point connector projection connection end in a third dimension out of said x-y plane.

17. The planar probing tip of claim 16, wherein said second test point connector projection body end is movably attached to said planar probing tip body to allow motion therebetween.

18. The planar probing tip of claim 16, wherein said motion actuator converts torque into linear force.

* * * * *

UNITED STATES PATENT AND TRADEMARK OFFICE
CERTIFICATE OF CORRECTION

PATENT NO. : 7,262,614 B1  Page 1 of 1
APPLICATION NO. : 11/352128
DATED : August 28, 2007
INVENTOR(S) : Julie A. Campbell It is certified that error appears in the above-identified patent and that said Letters Patent is hereby corrected as shown below:

Column 4,
Line 6, delete "48. Causing" and replace it with -- 48 causing --;
Line 14, delete "invention work" and replace it with -- invention works --; and
Line 40, delete "noted," and replace it with -- noted --.

Column 7,
Line 35, after "is" insert -- a --.

Column 9,
Line 59, after "that" insert -- it --.

Column 15,
Line 41, before "may be" insert -- that --.

Column 16,
Line 23, in Claim 1, delete "end" and replace it with -- ends --.

Column 18,
Line 56, in Claim 16, delete "x-v" and replace it with -- x-y --.

Signed and Sealed this

Fourteenth Day of October, 2008

JON W. DUDAS
*Director of the United States Patent and Trademark Office*